United States Patent
Theuss

(10) Patent No.: US 7,745,916 B2
(45) Date of Patent: Jun. 29, 2010

(54) MODULE COMPRISING POLYMER-CONTAINING ELECTRICAL CONNECTING ELEMENT

(75) Inventor: Horst Theuss, Wenzenbach (DE)

(73) Assignee: Infineon Technologies AG, Munich (DE)

( * ) Notice: Subject to any disclaimer, the term of this patent is extended or adjusted under 35 U.S.C. 154(b) by 523 days.

(21) Appl. No.: 11/638,847

(22) Filed: Dec. 14, 2006

(65) Prior Publication Data

US 2008/0122051 A1 May 29, 2008

(30) Foreign Application Priority Data

Nov. 29, 2006 (DE) .................. 10 2006 056 361

(51) Int. Cl.
*H01L 23/12* (2006.01)
(52) U.S. Cl. .................. 257/678; 257/741; 257/773
(58) Field of Classification Search .................. 257/678, 257/741, 773
See application file for complete search history.

(56) References Cited

U.S. PATENT DOCUMENTS

| 4,811,081 | A  | * | 3/1989 | Lyden ........................ 257/668 |
| 6,435,414 | B1 |   | 8/2002 | Zafrany et al. |
| 6,749,889 | B2 | * | 6/2004 | Takezawa et al. ............. 427/58 |
| 2002/0005247 | A1 | * | 1/2002 | Graham et al. .............. 156/291 |
| 2007/0034997 | A1 | * | 2/2007 | Bauer et al. ................. 257/676 |
| 2007/0075299 | A1 | * | 4/2007 | Ninomiya et al. ........... 252/500 |

FOREIGN PATENT DOCUMENTS

| DE | 10 2005 015 454 A1 | 10/2006 |
| DE | 10 2005 034 873 A1 | 2/2007 |
| DE | 10 2005 037 321 A1 | 2/2007 |

\* cited by examiner

*Primary Examiner*—Roy K Potter
(74) *Attorney, Agent, or Firm*—Brinks Hofer Gilson & Lione

(57) ABSTRACT

The invention relates to a module having a carrier element with electrical contact elements and a component applied to the carrier element with electrical connections on the side remote from the carrier element. The electrical connections of the component are electrically connected to contact elements of the carrier element via polymer-containing connecting elements.

24 Claims, 2 Drawing Sheets

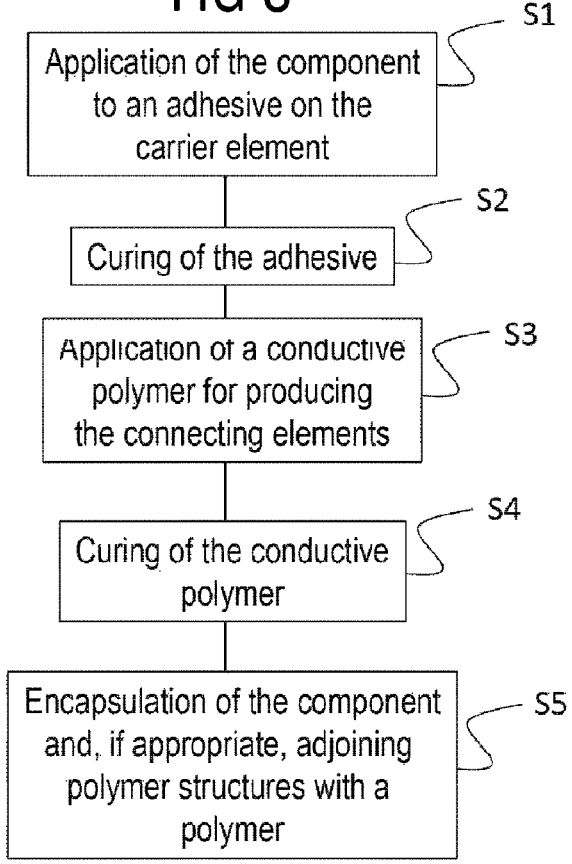
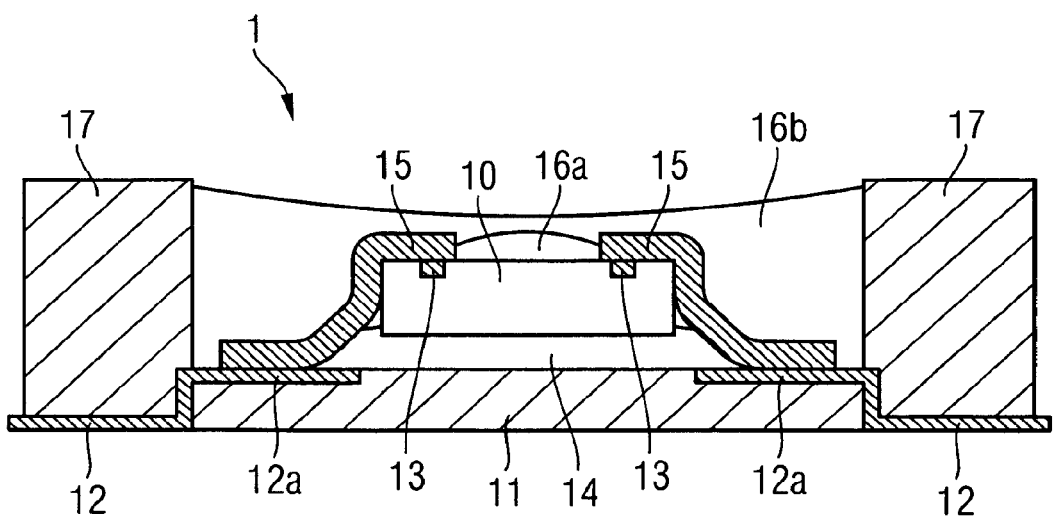

US 7,745,916 B2

MODULE COMPRISING POLYMER-CONTAINING ELECTRICAL CONNECTING ELEMENT

CROSS-REFERENCE TO RELATED APPLICATIONS

This application claims priority to German Patent Application DE 10 2006 056 361.1, filed Nov. 29, 2006, which is herein incorporated in its entirety by reference.

BACKGROUND

1. Field of the Invention

The invention relates to a module comprising a component applied on a carrier element and, in particular, the electrical contact-connection of the component.

2. Description of Related Art

In microelectronics, components are usually mounted on carrier elements and subsequently packaged (e.g. encapsulated with plastics by injection-molding), whereby the intention is to ensure that the components are protected against harmful ambient influences. When packaging the component, during later mounting steps or in the event of temperature cycles during operation, mechanical strains can occur between the component and the materials surrounding the component. Since many components such as sensors react sensitively to mechanical strains and their functioning is impaired by said strains, it is desirable to reduce such mechanical strains. In practice, this is often achieved by thickening the adhesive that connects the component to the carrier element, since lateral and bending forces can be better absorbed by a thicker adhesive layer. However, the thickness of the adhesive layer and hence the quantity of the strains taken up by the adhesive are upwardly limited in conventional methods for producing the electrical contact-connection of the component with the carrier element.

SUMMARY

Against this background, a module in accordance with a first aspect comprises a carrier element with electrical contact elements and also a component applied to the carrier element with electrical connections on the side remote from the carrier element. An electrical connection of the component is electrically connected to an electrical contact element of the carrier element by means of a polymer-containing connecting element.

In accordance with a further aspect, a module comprises a carrier element with electrical contact elements, a component applied to the carrier element with electrical connections, and also a polymer-containing, electrically conductive connecting element between one of the electrical connections of the component and one of the contact elements of the carrier element. The connecting element extends over a lateral area of the component.

Further objects, features and advantages of this invention will become readily apparent to persons skilled in the art after a review of the following description, with reference to the drawings and claims that are appended to and form a part of this specification.

BRIEF DESCRIPTION OF THE DRAWINGS

FIG. 3 shows a flow diagram for elucidating a method for producing a module; and FIG. 4 shows a schematic cross-sectional illustration of a third module.

DETAILED DESCRIPTION

A description is given below of modules comprising a component, which may be an electrical, electromechanical or else electro-optical component. Integrated circuits, sensor chips or microelectromechanical components (MEMS) shall be mentioned as examples thereof. In the case of sensor chips, pressure or magnetic sensors (e.g. Hall or GMR (giant magnetoresistance) sensors), in particular, may be involved.

The modules described furthermore comprise a carrier element, onto which the component is mounted. In this case, the carrier element may be produced for example from a metal, a metal alloy, a dielectric, a plastic or a ceramic, but may also comprise a plurality of the materials mentioned. The carrier element may be constituted homogeneously, and may also comprise structures such as, for example, conductor tracks with a rewiring function. Concrete examples of a carrier element are a die pad with a leadframe or a substrate with a rewiring functionality such as is used in flip-chip technology, by way of example.

The component has electrical connections, at least one of these connections being electrically connected to an electrical contact element on the carrier element via an electrically conductive connecting element. In this case, the connecting element is at least partly produced from a polymer. In particular, the connecting element may be produced from an epoxy resin whose conductivity is provided by admixed metal grains, in particular silver grains. The connecting element may also be one made of an intrinsically conductive polymer material (e.g. polyacetylenes, polypyroles).

Figure 1:
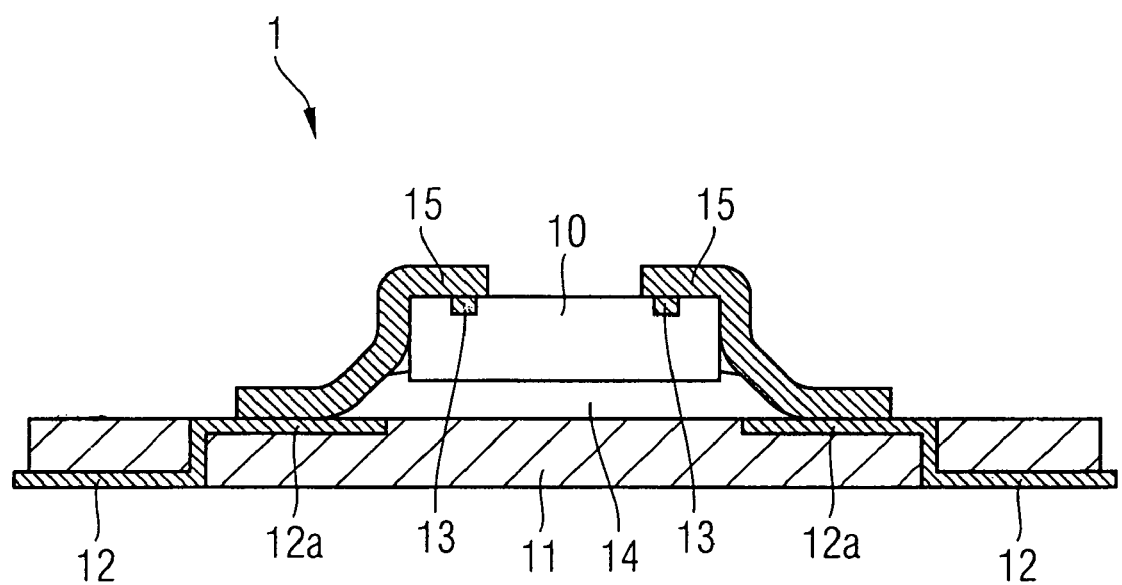
FIG. 1 shows a schematic cross-sectional illustration of a module.

Identical or similar parts are designated by the same reference symbols in the figures. FIG. 1 illustrates a module 1 in cross section as an exemplary embodiment. The module 1 comprises a component 10, for example a semiconductor chip or a sensor chip, and also a carrier element 11, on which the component 10 is mounted. The carrier element 11 may be realized as a so-called premolded housing made of plastic. Furthermore, external contact connections 12 (leads) are illustrated, which may be parts of a metal frame (leadframe) which surrounds the component 10 and comprises numerous external contact connections 12 of this type. The external contact connections 12 have uncovered contact areas 12a arranged on the carrier element 11 and project for example laterally or at the underside of the carrier element 11 from the premolded housing.

Instead of a premolded housing with an integrated leadframe for the external contact connections 12, it is also possible to use a carrier element which comprises a dielectric substrate in which a signal distribution for the purpose of the electrical contact-connection of the carrier element 11 to an external circuit arrangement is effected by means of rewiring lines produced photolithographically (said rewiring lines may run in a manner corresponding to the external contact connections 12 shown in FIG. 1).

A further possibility (not illustrated) consists in producing the carrier element 11 from a metal such as aluminum, copper or gold. Metal carriers of this type are known as die pads in the fabrication of semiconductor components. In this case, the signal distribution may once again be effected by a leadframe (corresponding to the external contact connections 12), in which case the external contact connections must not be electrically connected to the metal carrier.

The component 10 and the carrier element 11 are fixed to one another by means of an adhering adhesive 14, the adhesive 14 at least partly comprising a polymer. In practice, adhesion agents comprising epoxy resins are often used as adhesive 14. It is also possible to use silicones, bismaleimides, etc., in each case with or without fillers.

Electrical connections 13 of the component 10 are electrically connected to the external contact connections 12 via electrically conductive connecting elements 15. This provides an electrical contact between the component 10 and external applications. Electrical signals can thus be communicated from the electrical connections 13 of the component 10 via the connecting elements 15 and the external contact connections 12 to external applications, and vice versa.

An electrically conductive connecting element 15 may also extend between one or more connections 13 of the component 10 and the carrier element 11 (which is metallic in this case). As a result, charge that accumulates on the component 10 during the operation of the module can be dissipated to the carrier element 11. Connecting elements having the functionality described are the ground bonds known from the art.

The connecting elements 15 are at least partly produced from a polymer, in particular an epoxy resin. The conductivity may be brought about e.g. by admixed silver particles. The connecting elements 15 are formed as elongate layer elements in the manner of a wire in the embodiment shown in FIG. 1. They bear essentially along their entire length on the component 10 and, if appropriate, the adhesive 14 and also the carrier element 11—that is to say are supported rather than self-supported, in contrast to conventional metallic bonding wires.

If the component 10 is electrically conductive, the connecting elements 15 have to be insulated from the component 10. If the component 10 is a chip, it is possible, if appropriate, to use a chip design which precludes a short circuit in the case of lateral contact-connection. Otherwise the chip lateral edge has to be electrically insulated from the connecting element 15. This may be effected by depositing a passivation layer (e.g. $SiO_2$ layer from a plasma deposition process) after the singulation of a wafer into the component 10 (chip). Further possibilities for passivating the lateral areas consist in a thermal oxidation of the lateral areas, the application of an insulating layer to the lateral areas of the chip after chip mounting (for example by application of an insulating polymer around the chip) or by application or lamination of a film onto the chip with subsequent opening of the film at the electrical connections 13. The methods mentioned can be used not only in the case of chips but also in the case of other components.

The polymer-containing, electrically conductive connecting elements 15 replace metallic bonding wires which are used in conventional modules. The use of metallic bonding wires in conventional modules has the consequence that the thickness of the adhesive 14 is limited. The reason for this is that metallic bonding wires are fixed to the respective contact areas by a friction welding operation by means of the application of ultrasound. In the case of an excessively thick adhesive layer, the wire bonding method no longer functions since, in this case, enough ultrasound energy for producing the desired electrical contact-connection can no longer couple in on account of the elastic mounting of the component 10.

In the case of the embodiment illustrated in FIG. 1, that is to say in the case of a module whose connecting elements 15 are not provided by conventional wire bonds, but rather by polymer-containing connecting elements 15, the problem of an upper limitation of the adhesive thickness can be circumvented since other methods are used for producing an electrical connection between the electrical connections 13 of the component 10 and the external contact connections 12 of the carrier element 11. These methods are explained in more detail below. As a result, it is possible to use adhesive thicknesses which lie above the thickness of 100 micrometers. Even larger adhesive thicknesses of above 150 or 200 or 250 micrometers are possible by means of the method according to the invention.

Figure 2:
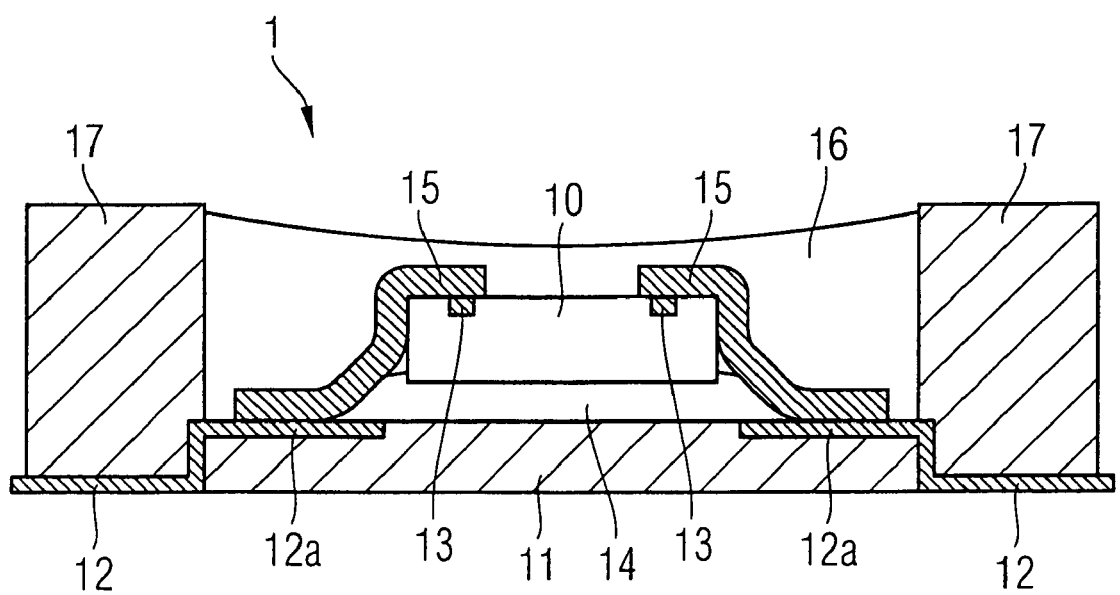
FIG. 2 shows a schematic cross-sectional illustration of a further module.

The described elements of the module 1 can be encapsulated with a potting composition 16 as in the module 2 illustrated in FIG. 2. For this purpose, the component 10 can be mounted in a cavity or depression. The depression may be realized by side walls 17 which may likewise be at least partly produced from a polymer and form for example integral constituent parts of the carrier element 11 (that is to say of a premolded housing, by way of example). The potting composition 16 may be for example a globe top or polymer potting material or a non-conductive silicone gel. The potting composition 16 may serve to protect the elements of the module against ambient influences, such as dirt, moisture or else mechanical impacts.

During the potting step with potting composition 16, mounting of the module 2 or the operation of the module 2, lateral and bending stresses can occur between the component 10 and elements of the module 2 which adjoin the component 10. Especially the aforementioned bending stresses are undesirable in the case of pressure sensors since they greatly influence the functioning of the sensor chip. Whereas in conventional modules, mutually adjoining module constituents (in particular polymer and metal constituents) generally have different coefficients of thermal expansion, in the case of the modules 1, 2 the material properties of the module components (e.g. adhesive 14, connecting element 15, potting composition 16) that are in mechanical contact with the electrical component 10, as will be explained in more detail below, can be coordinated with one another or matched to one another in such a way that the mechanical forces acting on the component 10 can be kept small.

One relevant material variable for the aforementioned coordination of the materials surrounding the component 10 is the coefficient of thermal expansion of said materials. In the case of similar coefficients of thermal expansion of the affected module components, strains produced by temperature fluctuations at the interfaces are reduced. The coefficients of thermal expansion of the adhesive 14, of the connecting element 15 and of the potting composition 16 can be highly varied by variations of fillers, e.g. within the range of $10 \cdot 10^{-6}$ $K^{-1}$ (high degree of filling) to $80 \cdot 10^{-6}$ $K^{-1}$ (unfilled). This enables the mechanical material properties of the components (in the present example the connecting element 15, the adhesive 14 and, if appropriate, the potting composition 16) that surround the component 10 to be coordinated among one another. By way of example, the degree of filling of the components may be chosen such that the coefficients of thermal expansion thereof do not deviate from one another by more than 50% (if appropriate 30%).

Furthermore, the adaptation of the coefficients of thermal expansion of the components (e.g. connecting element 15, adhesive 14, if appropriate potting composition 16) surrounding the component 10 to the coefficient of thermal expansion of the component 10 is to be taken into account. The coefficient of thermal expansion of silicon (approximately $4 \cdot 10^{-4}$ $K^{-1}$) must be taken into consideration in the case of a silicon chip. The degree of filling of the polymer-containing components should therefore be chosen to be relatively high and may lie for example within the range of $10 \cdot 10^{-6}$ $K^{-1}$ to $30 \cdot 10^{-6}$ $K^{-1}$. Such an adaptation of the coefficients of thermal expansion of said materials makes it possible to obtain a reduction in the lateral and bending stresses already described, both during the potting step and in the event of a temperature cycle taking place during later operation.

A further material variable which can be coordinated between affected module components is the modulus of elasticity of said components. By means of adapted, that is to say similar moduli of elasticity of mutually adjoining module components, lateral and bending stresses can likewise be kept small. By way of example, a maximum deviation of 50% (if appropriate 30%) may be provided, if appropriate, for the moduli of elasticity, too. An adaptation of the moduli of elasticity has a favorable effect in the case where external mechanical stresses occur (e.g. during module mounting).

A third influencing variable is the glass transition points of the polymer-containing materials used. The glass transition point of a polymer can be understood as a kind of phase transition. If a polymer-specific glass transition temperature is exceeded, the friction between the molecules of the polymer is reduced, that is to say that the polymer becomes more elastic at a macroscopic level. The polymer has a more brittle constitution below said polymer-specific glass transition temperature. Therefore, for the "floating" mounting described above, the polymer-containing materials used for the production of the module components should have a glass transition temperature which lies below the application-specific operating temperature of the module. Typical glass transition temperatures for the adhesive 14 and the connecting element 15 lie within the range of between 0° and 100° C., by way of example. In the case of potting materials, the glass transition point can vary over a wide range. In the case of gels, which are preferred for a particularly stress-free mounting of the component 10, a typical glass transition temperature is of the order of magnitude of −100° C. Typical potting compositions 16, for example thermosetting plastics, have a glass transition temperature of approximately 150° C.

Furthermore, specifically in the case of optical components 10 and an encapsulation of said components 10 by a plurality of materials, it may be of importance that the materials enveloping the component 10 are transparent and their optical properties are coordinated with one another. Epoxy resin or silicone may likewise be used as transparent potting composition 16. In the case of a transparent potting composition 16, it may be necessary to reduce the concentration of the fillers or completely dispense with fillers, since the latter lead to turbidity or reduction of the transparency in the event of thermal loading.

It is pointed out that the component 10 illustrated in FIGS. 1 and 2 is surrounded solely and, if appropriate, completely, that is to say at all outer areas, by materials which are produced from a polymer.

The "floating" mounting of the component 10 that can be obtained by means of a thick adhesive is not impaired or is impaired only insignificantly by the electrical connecting elements 15 and may possibly be additionally improved by the electrical connecting elements 15. The potting composition 16 may likewise have a favorable influence on the "floating" mounting of the component 10.

The method illustrated in FIG. 3 involves firstly providing the component 10 having electrical connections 13 and also the carrier element 11. The component 10 is then applied on the carrier element 11, see step 1. The adhesive 14, which at least partly comprises a polymer, is used for this purpose. The adhesive 14 is non-conductive in order not to produce a short circuit with the connecting elements 15 that possibly run over the adhesive 14. Moreover, it is thus possible to prevent a short circuit between the component 10 and the possibly conductive carrier element 11 if contact is not desired. The above-described possibility of an increased thickness of the adhesive 14 is afforded. After the application of the component 10 to the adhesive 14, the latter is cured (step S2).

In method step S3, an electrical connection between the electrical connections 13 of the component 10 and the contact areas 12a of the external contact connections 12 is produced by means of the electrically conductive connecting element 15. For this purpose, the connecting element 15 is firstly applied in liquid form to the component 10 (and possibly further module elements such as the adhesive 14 or the carrier element 11) (step S3). The application may be effected by means of a dispensing method. In this method, the polymer-containing material is "injected" onto the component 10 through a nozzle at a temperature of approximately 150° C. and subsequently cured in the furnace. The thickness of the wire-type connecting element 15 and also its geometrical form may be influenced by the geometrical form of the nozzle. A short circuit between the lateral edge of the component (chip) 10 and the connecting element 15 is prevented, in the manner already described, by previous passivation of the lateral edge of the component 10.

As an alternative to the dispensing method described, the polymer-containing connecting element 15 may also be applied to the component 10 by means of an ink-jet method. In this case, the polymer-containing material is "printed" onto the component 10 in a manner similar to the functioning of an ink-jet printer.

After the application of the conductive polymer, the latter is cured, e.g. by heating, see step S4.

Afterwards, the component 10 and, if appropriate, the adjoining polymer structures (e.g. adhesive 14, connecting elements 15) may additionally be encapsulated with a polymer-containing, non-conductive potting composition 16, such as silicone gel, by way of example. This method step may be effected in various ways.

One possibility consists in the dispensing method already mentioned, in which case here the component 10 should be mounted in a cavity or depression in accordance with FIG. 2. During dispensing, the arrangement within the depression is completely encapsulated by the potting composition 16 made of a (non-conductive) polymer material.

A further possibility consists in an injection-molding method, in which the component 10 and the adjoining polymer structures are encapsulated with thermosetting plastics or thermoplastics by injection-molding.

The encapsulation of the component 10 and also, if appropriate of the adjoining polymer structures may also be effected by a combination of the methods mentioned above. Firstly, a soft or elastic gel is applied by means of a dispensing method. The elastic gel may either encapsulate the entire arrangement within the depression or be applied only over the component 10 or over the sensitive active area thereof. A comparatively harder or less elastic polymer material may then be used for the outer encapsulation, which material, at least in the regions in which the elastic gel was applied, does not directly adjoin the component 10 or the adjacent polymer structures. The harder polymer material may be advantageous in the manner of an outer housing for the protection of the module, in which case the mechanical stress acting on the component 10 can furthermore be kept relatively low by means of the underlying soft gel. The outer encapsulation with the harder polymer material may be performed by means of a dispensing method or an injection-molding method. FIG. 4 shows an example of a module 3 produced in this way, the softer potting material or gel 16a only being deposited on the active area of the component 10 (e.g. pressure sensor) in the example illustrated here. The complete encapsulation of the component 10 and of the adjoining polymer structures is effected by the overlying harder polymer layer 16b.

It is pointed out that, in the case of pressure sensors, by way of example, a cavity (not illustrated) may be provided above the active area of the component 10, said cavity being connected to the environment by means of a channel passing through the potting composition 16, 16a, 16b. In this case, a diaphragm that serves for recording pressure and is present in the active area of the component 10 is not in contact with the potting composition 16, 16a, 16b. By way of example, tire pressure sensors may be of this structural type. In the case of other pressure sensors, such a cavity is not present, with the result that the preferably soft potting composition (gel) 16 transmits the pressure to be measured directly to a diaphragm situated in the active area of the component 10. By way of example, it is possible to realize pressure sensors for barometric altitude measurement without a cavity above the active area. The same also applies to pressure sensors which are used as airbag sensors (impact sensors) and respond to a pressure shock wave.

As a person skilled in the art will readily appreciate, the above description is meant as an illustration of implementation of the principles of this invention. This description is not intended to limit the scope or application of this invention in that the invention is susceptible to modification, variation and change, without departing from the spirit of this invention, as defined in the following claims.

The invention claimed is:

1. A module comprising:
   a carrier element with electrical contact elements;
   a component applied to the carrier element with electrical connections on the side remote from the carrier element; and
   a polymer-containing connecting element that electrically connects one of the electrical connections of the component to one of the electrical contact elements of the carrier element.

2. The module according to claim 1, the component being fixed on the carrier element by means of a polymer-containing adhesive.

3. The module according to claim 2, the thickness of the adhesive being at least 100 micrometers.

4. The module according to claim 2, the adhesive comprising an electrical insulator.

5. The module according to claim 2, the adhesive being established on the basis of an epoxy resin or a silicone or a bismaleimide.

6. The module according to claim 2, the connecting element and the adhesive having similar coefficients of thermal expansion.

7. The module according to claim 1, the carrier element and the connecting element being at least partly encapsulated by a polymer-containing potting composition.

8. The module according to claim 7, the potting composition comprising an inner potting composition component and an outer potting composition component surrounding the inner potting composition component, the inner potting composition component being softer than the outer potting composition component.

9. The module according to claim 7, the potting composition or at least one component of the potting composition being transparent.

10. The module according to claim 7, the connecting element and the potting composition having similar coefficients of thermal expansion.

11. The module according to claim 7, further comprising the component being fixed on the carrier element by means of a polymer-containing adhesive, the adhesive and the potting composition having similar coefficients of thermal expansion.

12. The module according to claim 11, the connecting element and/or the adhesive and/or the potting composition having a coefficient of thermal expansion similar to that of silicon.

13. The module according to claim 1, the component comprising a semiconductor chip.

14. The module according to claim 13, the component comprising a pressure sensor.

15. The module according to claim 1, component being mounted in a depression provided on the carrier element.

16. The module according to claim 1, the component being in mechanical contact solely with polymer materials.

17. The module according to claim 16, the polymer materials that mechanically make contact with the component encompassing the connecting element, an adhesive and/or a potting composition.

18. The module according to claim 1, the component being completely encapsulated by polymer materials.

19. The module according to claim 18, the polymer materials that encapsulate the component encompassing the connecting element, an adhesive and/or a potting composition.

20. The module according to claim 1, the connecting element comprising a polymer filled with conductive particles, in particular silver particles.

21. The module according to claim 1, the connecting element comprising an intrinsically conductive polymer.

22. The module according to claim 1, the electrical contact elements of the carrier element being formed in the form of a leadframe.

23. A module comprising:
   a carrier element with electrical contact elements;
   a component applied to the carrier element with electrical connections; and
   a polymer-containing, electrically conductive connecting element between one of the electrical connections of the component and one of the contact elements of the carrier element, the connecting element extending over a lateral area of the component.

24. The module according to claim 23, the connecting element bearing on the lateral area of the component.

* * * * *